(12) United States Patent
Takagi et al.

(10) Patent No.: US 11,211,265 B2
(45) Date of Patent: Dec. 28, 2021

(54) HEAT TREATMENT APPARATUS AND HEAT TREATMENT METHOD

(71) Applicant: Tokyo Electron Limited, Tokyo (JP)

(72) Inventors: Satoshi Takagi, Yamanashi (JP); Hiroyuki Hayashi, Yamanashi (JP); Hsiulin Tsai, Hsin-chu (TW)

(73) Assignee: TOKYO ELECTRON LIMITED, Tokyo (JP)

( * ) Notice: Subject to any disclaimer, the term of this patent is extended or adjusted under 35 U.S.C. 154(b) by 283 days.

(21) Appl. No.: 16/379,990

(22) Filed: Apr. 10, 2019

(65) Prior Publication Data
US 2019/0318945 A1    Oct. 17, 2019

(51) Int. Cl.
*F27B 5/14* (2006.01)
*F26B 19/00* (2006.01)
(Continued)

(52) U.S. Cl.
CPC ...... *H01L 21/67109* (2013.01); *C23C 16/455* (2013.01); *C23C 16/45563* (2013.01); *H01L 21/67248* (2013.01)

(58) Field of Classification Search
CPC ..... C23C 16/00; C23C 16/003; C23C 16/448; C23C 16/4481; C23C 16/4482; C23C 16/452; C23C 16/455; C23C 16/45502–45508; C23C 16/4551; C23C 16/45512–45578; C23C 16/45587; C23C 16/45593; C23C 16/4584; C23C 16/458; C23C 16/4581; C23C 16/4582; C23C 16/4586; C23C 16/4587; C23C 16/4588; (Continued)

(56) References Cited

U.S. PATENT DOCUMENTS 5,478,397 A * 12/1995 Shibata ................ C23C 16/455
                                                        118/724
7,432,475 B2 * 10/2008 Nakajima ................ F27B 5/04
                                                        118/50.1
(Continued)

FOREIGN PATENT DOCUMENTS

JP    2002-289615 A    10/2002
JP    2003-347288 A    12/2003
(Continued)

*Primary Examiner* — Sang Y Paik
(74) *Attorney, Agent, or Firm* — Abelman, Frayne & Schwab

(57) ABSTRACT

A heat treatment apparatus includes a processing container that accommodates a plurality of substrates, a gas supply unit that supplies a raw material gas into the processing container, an exhaust unit that exhausts the raw material gas in the processing container, and a heating unit that heats the plurality of substrates. The gas supply unit includes a gas supply pipe including: a first straight pipe portion that extends upward along a longitudinal direction of an inner wall surface of the processing container; a bent portion where a distal end side that extends above the first straight pipe portion is bent downward; a second straight pipe portion that extends downward from the bent portion; and a plurality of gas ejecting holes formed on the second straight pipe portion. The first straight pipe portion has a larger cross-sectional area than the second straight pipe portion.

12 Claims, 4 Drawing Sheets

(51) Int. Cl.
*H01L 21/67* (2006.01)
*C23C 16/455* (2006.01)

(58) Field of Classification Search
CPC ....... C23C 16/46; C23C 16/463; C23C 16/48; C23C 16/481; C23C 16/482; H01L 21/67098; H01L 21/67103; H01L 21/67109; H01L 21/671115; H01L 21/67248
USPC .......................... 219/390–398; 392/416–421
See application file for complete search history.

(56) References Cited

U.S. PATENT DOCUMENTS

| | | | | |
|---|---|---|---|---|
| 2015/0107517 | A1* | 4/2015 | Hasebe | C23C 16/452 118/723 E |
| 2015/0275369 | A1* | 10/2015 | Terada | C23C 16/45578 118/715 |
| 2017/0051408 | A1* | 2/2017 | Takagi | C23C 16/45563 |

FOREIGN PATENT DOCUMENTS

| | | |
|---|---|---|
| JP | 2008-016742 A | 1/2008 |
| JP | 2017-028256 A | 2/2017 |

* cited by examiner

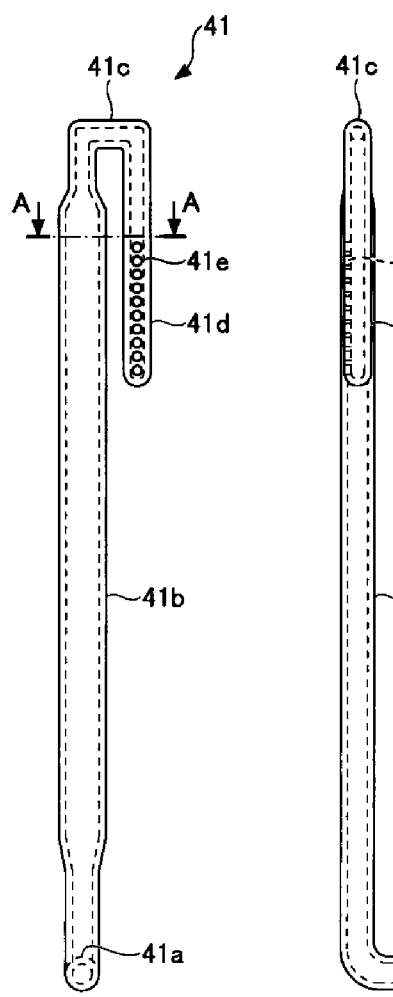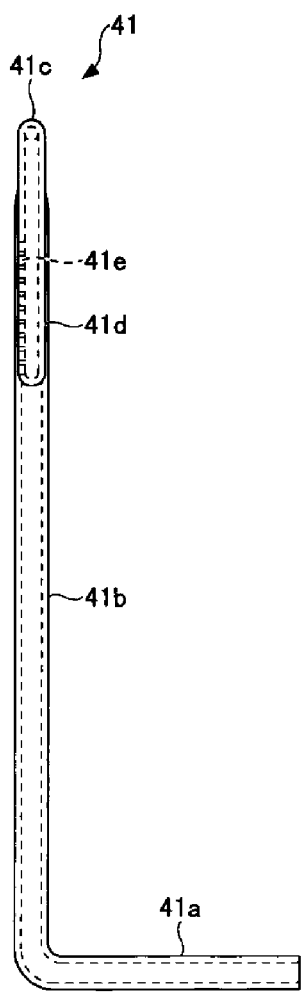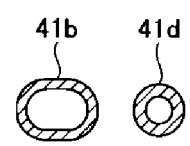
*FIG. 2A*     *FIG. 2B*     *FIG. 2C*

HEAT TREATMENT APPARATUS AND HEAT TREATMENT METHOD

CROSS-REFERENCE TO RELATED APPLICATIONS

This application is based on and claims priority from Japanese Patent Application No. 2018-076715 filed on Apr. 12, 2018 with the Japan Patent Office, the disclosure of which is incorporated herein in its entirety by reference.

TECHNICAL FIELD

The present disclosure relates to a heat treatment apparatus and a heat treatment method.

BACKGROUND

A heat treatment apparatus is known in which a plural number of wafers are loaded on a wafer boat in a vertical type processing container and a raw material gas is supplied upward from a gas supply pipe arranged on a lower side of the processing container to form a film on a surface of the wafer (see, e.g., Japanese Patent Laid-Open Publication Nos. 2008-016742 and 2002-289615).

SUMMARY

A heat treatment apparatus according to an aspect of the present disclosure includes a processing container configured to accommodate a plurality of substrates held by a substrate holder in a shelf shape, a gas supply source configured to supply a raw material gas into the processing container from a lower position of the processing container, an exhaust unit including a pump configured to exhaust the raw material gas in the processing container, and a heater arranged to cover the processing container and configured to heat the plurality of substrates. The gas supply source includes a gas supply pipe including: a first straight pipe portion that extends upward along a longitudinal direction of an inner wall surface of the processing container; a bent portion where a distal end side extending above the first straight pipe portion is bent downward; a second straight pipe portion that extends downward from the bent portion; and a plurality of gas ejecting holes formed in the second straight pipe portion. The first straight pipe portion has a larger cross-sectional area than that of the second straight pipe portion.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 2A to 2C are schematic views illustrating an exemplary configuration of a gas supply pipe.

DETAILED DESCRIPTION

Figure 1:
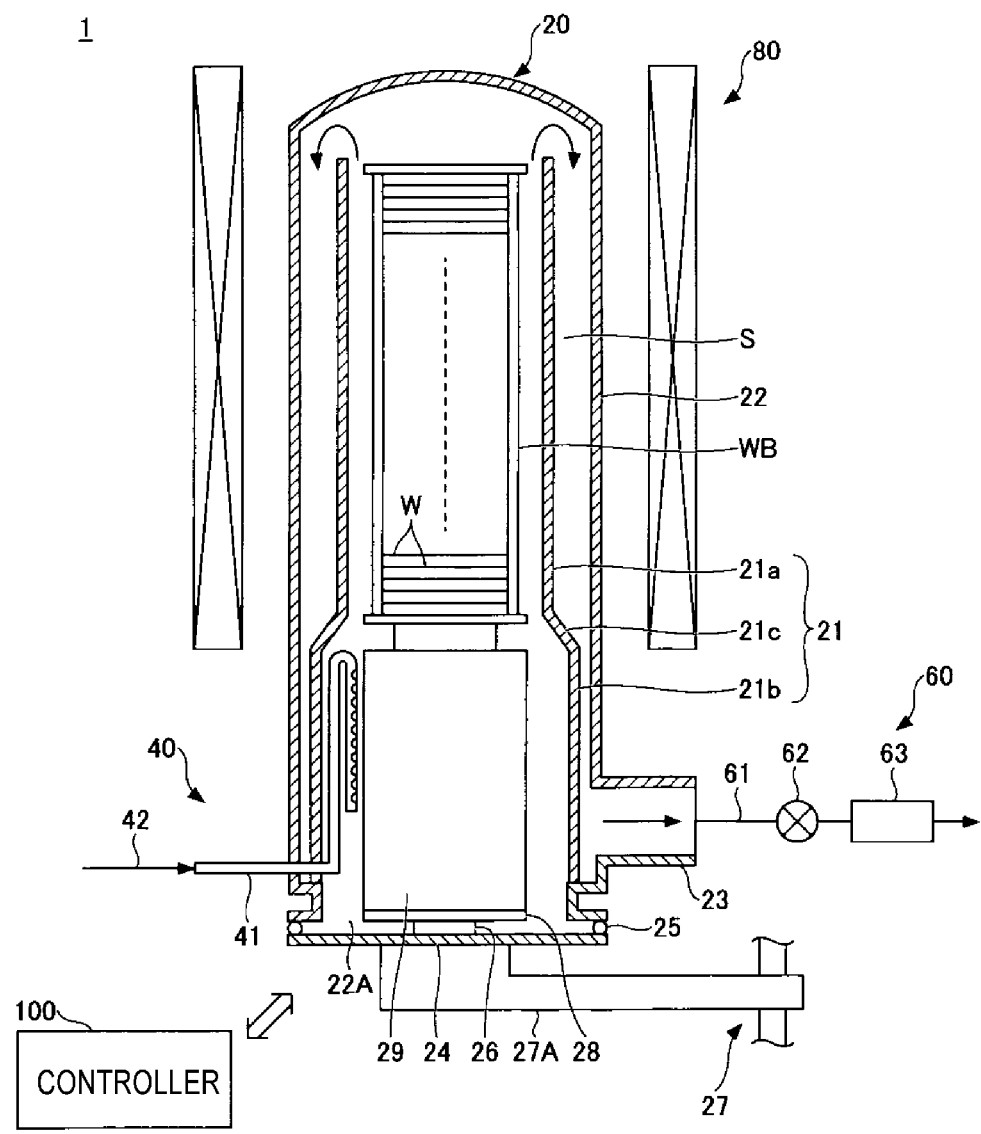
FIG. 1 is a schematic cross-sectional view illustrating an exemplary configuration of a heat treatment apparatus.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, non-limiting exemplary embodiments of the present disclosure will be described with reference to the accompanying drawings. In all of the accompanying drawings, the same or corresponding members or parts are denoted by the same or corresponding reference numerals, and redundant explanations are omitted.

[Heat Treatment Apparatus]

Descriptions will be made on an exemplary configuration of a heat treatment apparatus of an embodiment of the present disclosure. FIG. 1 is a schematic cross-sectional view illustrating an exemplary configuration of the heat treatment apparatus. The heat treatment apparatus illustrated in FIG. 1 is a batch-type vertical heat treatment apparatus that performs various heat treatments on a plural number of semiconductor wafers at a time.

The heat treatment apparatus 1 includes a processing container 20, a gas supply unit 40, an exhaust unit 60, a heating unit 80, and a controller 100.

The processing container 20 accommodates a wafer boat WB. The wafer boat WB holds a plural number (e.g., 150) of semiconductor wafers in multiple tiers in a horizontal posture with a predetermined interval in a height direction. In other words, the wafer boat WB holds a plurality of wafers W in a shelf shape. The processing container 20 includes an inner tube 21 and an outer tube 22. The inner tube 21 and the outer tube 22 are coaxially arranged to be a double tube structure. Meanwhile, the processing container 20 may be a single tube structure. The inner tube 21 and the outer tube 22 are made of a heat-resistant material such as, for example, quartz or silicon carbide (SiC).

The inner tube 21 is formed in, for example, a substantially cylindrical shape in which the diameter is enlarged at the lower side than the upper side. Meanwhile, the inner tube 21 may be formed in, for example, a substantially cylindrical shape that has a same diameter from the lower end to the upper end. The inner tube 21 has a first cylindrical portion 21a, a second cylindrical portion 21b, and a connecting portion 21c.

The first cylindrical portion 21a is a portion that is located on the upper side of the inner tube 21. The first cylindrical portion 21a has an inner diameter that forms a small gap to the extent that the inner wall surface thereof and the wafer boat WB are not brought into contact with each other. As a result, the distance between the outer peripheral portion of each wafer W and the inner wall surface of the inner tube 21 is shortened. Therefore, a raw material gas supplied from the lower position of the inner tube 21 is sufficiently supplied onto the surface of each wafer W, and thus, the in-plane uniformity of the film formed on the wafer W is improved. The gap between the inner wall surface of the first cylindrical portion 21a and the wafer boat WB may be, for example, a gap in which the gas supply tube cannot be arranged. The upper end of the first cylindrical portion 21a may be, for example, the same height as the upper end of the wafer boat WB accommodated in the inner tube 21 or the height higher than the upper end of the wafer boat WB. The lower end of the first cylindrical portion 21a may be, for example, the same height as the lower end of the wafer boat WB accommodated in the inner tube 21 or the height lower than the lower end of the wafer boat WB. Since the upper end and the lower end of the first cylindrical portion 21a have the above-described configuration, the distance between the outer peripheral portions of all of the wafers W held in the wafer boat WB and the inner wall surface of the inner tube 21 is shortened. Therefore, the raw material gas supplied from the lower position of the inner tube 21 is sufficiently supplied onto the surfaces of all of the wafers W, and thus, inter-plane uniformity is improved.

The second cylindrical portion 21b is a portion that is located on the lower side of the inner tube 21. The second cylindrical portion 21b is provided on the lower side of the first cylindrical portion 21a via the connecting portion 21c. The second cylindrical portion 21b has an inner diameter larger than the inner diameter of the first cylindrical portion 21a.

The connecting portion 21c is a portion that connects the first cylindrical portion 21a and the second cylindrical portion 21b. The connecting portion 21c is formed such that the inner diameter is increased from the upper side to the lower side.

The outer tube 22 is formed in a substantially cylindrical shape with a ceiling that covers the outer side of the inner tube 21 with its lower end portion opened. That is, the upper portion of the outer tube 22 is closed.

A gas outlet 23 is formed at the inner wall of the lower portion of the outer tube 22. A cover 24 is air-tightly attached to an opening 22A at the lower end of the outer tube 22 via a sealing member 25 such as an O-ring, and air-tightly closes the opening 22A at the lower end of the processing container 20 to be sealed. The cover 24 is configured to be capable of opening/closing the opening 22A. The cover 24 is made of, for example, stainless steel. A rotation shaft 26 is provided at the center portion of the cover 24 to penetrate through a magnetic fluid sealing portion (not illustrated). A lower portion of the rotation shaft 26 is rotatably supported by an arm 27A of a lift unit 27 formed of a boat elevator. A rotation plate 28 is provided on the upper end of the rotation shaft 26. The wafer boat WB is placed on the rotation plate 28 via a heat insulating cylinder 29 made of, for example, quartz. As a result, the cover 24 and the wafer boat WB are integrally moved up or down by lifting or lowering the lifting unit 27, so that the wafer boat WB can be inserted into or removed from the processing container 20.

The gas supply unit 40 is provided at the lower portion of the processing container 20, and supplies the raw material gas to the inner tube 21. In the example in FIG. 1, the gas supply unit 40 includes one gas supply pipe 41. However, the gas supply unit 40 may have a plurality of gas supply pipes. The gas supply pipe 41 is connected with a pipe 42 to introduce the raw material gas. A mass flow controller or a valve (all not illustrated) is interposed in the pipe 42 to adjust the gas flow rate. The raw material gas may be appropriately selected depending on the type of the film to be formed. For example, in case of forming a silicone film, a silicon containing gas such as monosilane gas ($SiH_4$ gas) or disilane ($Si_2H_6$) may be used. Further, the gas supply pipe 41 may be connected with a pipe for introducing another gas such as a cleaning gas or a purge gas.

The gas supply pipe 41 is formed of, for example, a quartz pipe, and is provided, for example, at a position lower than a region where the wafer W is arranged. In the example in FIG. 1, the gas supply pipe 41 is provided in the second cylindrical portion 21b. In other words, the upper end of the gas supply pipe 41 is positioned substantially at the same height as or lower than the upper end of the second cylindrical portion 21b. A base end side of the gas supply pipe 41 is connected to the pipe 42, for example, by penetrating the outer tube 22, and the distal end side thereof is closed. The gas supply pipe 41 penetrates the outer tube 22 and the inner tube 21 and extends into the inner tube 21, then is provided to be bent in an L-shape so as to be vertically upright upward along the inner wall surface of the inner tube 21. Further, the gas supply pipe 41 is formed such that the distal end that is upright upward is bent downward in a U-shape and extends vertically. In the example in FIG. 1, the gas supply pipe 41 is formed to be bent along a circumferential direction of the inner tube 21. Meanwhile, the gas supply pipe 41 may be formed to be bent toward the inside or the outside of the inner tube 21. Hereinafter, an exemplary configuration of the gas supply pipe 41 will be described in detail with reference to FIGS. 2A to 2C.

FIGS. 2A to 2C are views illustrating an exemplary configuration of the gas supply pipe 41. FIG. 2A is a side view when the gas supply pipe 41 is viewed from the center side of the processing container 20, and FIG. 2B is a side view when the gas supply pipe 41 is viewed from the circumferential direction side of the processing container 20, and FIG. 2C is a cross-sectional view taken along a line A-A of the gas supply pipe 41 in FIG. 2A.

As illustrated in FIGS. 2A to 2C, the gas supply pipe 41 includes an introducing portion 41a, a first straight pipe portion 41b, a bent portion 41c, and a second straight pipe portion 41d.

The introducing portion 41a is a portion that extends in the horizontal direction, and one end thereof is connected to the pipe 42 by penetrating the inner tube 21 and the outer tube 22 and the other end is bent upward in an L-shape so as to communicate with the first straight pipe portion 41b. The introducing portion 41a is formed of, for example, a quartz pipe having a circular cross section.

The first straight pipe portion 41b extends upward along the longitudinal direction of the inner wall surface of the inner tube 21, so that the lower end communicates with the other end of the introducing portion 41a and the upper end communicates with one end of the bent portion 41c. The first straight pipe portion 41b is formed such that the cross-sectional area thereof is larger than that of the second straight pipe portion 41d in the cross section perpendicular to the longitudinal direction. In the example in FIGS. 2A to 2C, the shape of the cross section of the first straight pipe portion 41b perpendicular to the longitudinal direction is an elliptical shape, and the shape of the cross section of the second straight pipe portion 41d perpendicular to the longitudinal direction is a circular shape. The area of the ellipse is larger than the area of the circle. Meanwhile, the shape of the cross section of the first straight pipe portion 41b perpendicular to the longitudinal direction thereof may be, for example, a circular shape or a rectangular shape. The first straight pipe portion 41b is formed of, for example, a quartz pipe.

The bent portion 41c is bent in a substantially U-shape from the upper side to the lower side, and one end thereof communicates with the upper end of the first straight pipe portion 41b and the other end communicates with the upper end of the second straight pipe portion 41d. The bent portion 41c is formed of, for example, a quartz pipe having a circular cross section.

The second straight pipe portion 41d extends downward along the longitudinal direction of the inner wall surface of the inner tube 21, so that the upper end communicates with the other end of the bent portion 41c and the lower end is closed. The shape of the cross section of the second straight pipe portion 41d perpendicular to the longitudinal direction thereof is a circular shape. Meanwhile, the shape of the cross section of the second straight pipe portion 41d perpendicular to the longitudinal direction thereof may be, for example, an elliptical shape or a rectangular shape. A gas ejecting hole 41e is formed in the second straight pipe portion 41d. In the example in FIGS. 2A to 2C, ten gas ejecting holes 41e are formed along the longitudinal direction of the second straight pipe portion 41d. Meanwhile, the number of the gas ejecting hole 41e is not limited to that of the example in FIGS. 2A to 2C. Further, gas ejecting holes (not illustrated) other than the gas ejecting holes 41e may be formed at the closed lower end of the second straight pipe portion 41d.

The gas ejecting holes 41e are, for example, a circular shape, and formed, for example, at equal intervals along the longitudinal direction of the second straight pipe portion 41d. The hole diameter of the gas ejecting hole 41e may be, for example, 0.1 mm to 1.0 mm. The gas ejecting hole 41e ejects the gas in the horizontal direction. In the examples in FIG. 1 and FIGS. 2A to 2C, the gas ejecting hole 41e is formed on a center portion side of the processing container 20, and ejects in the central direction of the processing container 20. Meanwhile, the gas ejecting hole 41e may be formed, for example, at a position that is shifted by a predetermined angle with respect to the central direction of the processing container 20, and may be formed on the inner wall surface side of the inner tube 21. Further, in the example in FIG. 1, the gas ejecting hole 41e at the highest position among the plurality of gas ejecting holes 41e is formed on the side lower than the lowest surface of the wafer boat WB.

The exhaust unit 60 exhausts the gas in the processing container 20. The exhaust unit 60 includes an exhaust passage 61 that is connected to the gas outlet 23. A pressure adjusting valve 62 and a vacuum pump 63 are interposed in order in the exhaust passage 61, so that the inside of the processing container 20 may be evacuated. The exhaust unit 60 exhausts the gas in the inner tube 21 through, for example, a space S between the inner tube 21 and the outer tube 22.

The heating unit 80 heats the wafer W accommodated in the processing container 20. The heating unit 80 is formed in a substantially cylindrical shape, for example, to cover the outer tube 22 around the outer tube 22. The heating unit 80 may be formed of a plurality of heaters that is vertically divided in a plural number and each of which is independently controlled, or may be formed of one heater that is not divided.

The controller 100 controls the operation of the entire apparatus. The controller 100 includes a central processing unit (CPU), a read only memory (ROM), and a random access memory (RAM). The CPU executes a desired heat treatment according to a recipe stored in a memory area such as the RAM. Control information of the apparatus with respect to the process condition is set in the recipe. The control information may be, for example, gas flow rate, pressure, temperature, and process time. A program used by the recipe and the controller 100 may be stored in, for example, a hard disk or a semiconductor memory. Further, the recipe may be set at a predetermined position and read out while being stored in a storage medium readable by a portable computer such as a CD-ROM or a DVD. The controller 100 may be provided separately from the heat treatment apparatus 1.

An example of a method (heat treatment method) for performing a predetermined heat treatment on the wafer W by the heat treatment apparatus 1 having such configuration will be described.

First, a plurality of wafers W are carried into the wafer boat WB held and the processing container 20 by the lift unit 27, and the opening 22A at the lower end of the processing 20 is air-tightly closed to be sealed by the cover 24. Subsequently, evacuation is performed by the exhaust unit 60 so that the internal pressure of the processing container 20 becomes a predetermined degree of vacuum, and the raw material gas is supplied from the gas supply pipe 41. Further, the wafer W in the processing container 20 is heated by the heating unit 80, and the heat treatment is performed while rotating the wafer boat WB. As a result, a film is formed on the wafer W.

According to the heat treatment apparatus 1 described above, the gas supply pipe 41 that supplies the raw material gas into the processing container 20 from the lower position of the processing container 20 includes the first straight pipe portion 41b that extends upward along the longitudinal direction of the inner wall surface of the processing container 20, the bent portion 41c in which the distal end side of the first straight pipe portion 41b that extends upward is bent downward, and the second straight pipe portion 41d that extends downward from the bent portion 41c. As a result, as compared with a gas supply pipe that does not have the bent portion 41c, the length of the gas supply pipe 41 becomes longer, and the time for which the raw material gas stays in the gas supply pipe 41 becomes longer. As a result, since the time for which the raw material gas is heated in the gas supply pipe 41 becomes longer, it is possible to promote activation of the raw material gas inside the gas supply pipe 41 as compared with a case in the related art.

Further, the first straight pipe portion 41b has a larger cross-sectional area than the second straight pipe portion 41d. As a result, the flow of the raw material gas in the first straight pipe portion 41b is slow down, and the time for which the raw material gas stays in the gas supply pipe 41 becomes longer. Therefore, the time for which the raw material gas is heated in the gas supply pipe 41 becomes longer. As a result, it is possible to particularly promote the activation of the raw material gas inside the gas supply pipe 41.

Further, the shape of the cross section of the first straight pipe portion 41b perpendicular to the longitudinal direction thereof is formed in an elliptical shape. As a result, since the contact area between the raw material gas and the inner tube wall of the first straight pipe portion 41b becomes large, the heating of the raw material gas in the first straight pipe portion 41b is promoted. As a result, it is possible to particularly promote the activation of the raw material gas inside the gas supply pipe 41.

Example

An example for confirming the effect exerted by the heat treatment apparatus 1 according to the embodiment of the present disclosure will be described.

First, a silicon film was formed on the wafer W by using the heat treatment apparatus 1 described with reference to FIG. 1 (Example 1). Further, for comparison, a silicon film was formed on the wafer W by using a heat treatment apparatus including a straight pipe-shaped gas supply pipe that penetrates the processing container 20 at the lower position of the processing container and does not include a bent portion, instead of the gas supply pipe 41 in FIG. 1

(Comparative Example 1). Subsequently, film thicknesses of the silicon films that were formed on the wafer W in Example 1 and Comparative Example 1 were measured.

Figure 3:
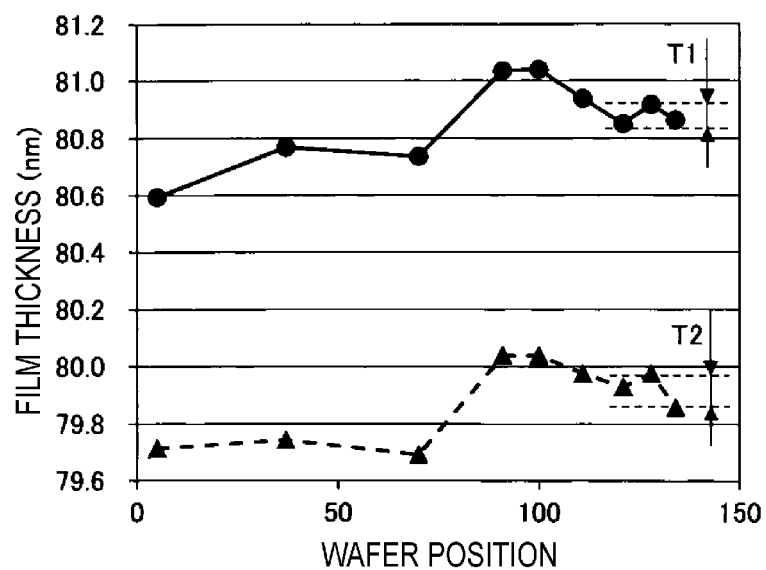
FIG. 3 is a view illustrating a relationship between a wafer position and a film thickness.

FIG. 3 is a view illustrating a relationship between a wafer position and a film thickness. In FIG. 3, the wafer position is illustrated on the horizontal axis, and the film thickness (nm) of the silicon film is illustrated on the vertical axis. The wafer position refers a position of a plural number of wafers that are held in a shelf shape on the wafer boat WB, and a smaller number is assigned to a position close to the upper tier side. Further, in FIG. 3, the result of Example 1 is illustrated in a circular shape, and the result of Comparative Example 1 is illustrated in a triangular shape.

As illustrated in FIG. 3, when the gas supply pipe 41 of Example 1 is used, the film thicknesses of the silicon films formed on the wafers W that are held in the lower region (e.g., slots 120 to 133) were 80.85 nm to 80.92 nm. That is, the difference T1 between the upper limit value and the lower limit value of the film thicknesses of the wafers W held in the lower region of the wafer boat WB was 0.1 nm or less. Meanwhile, when the gas supply pipe of Comparative Example 1 is used, the film thicknesses of the silicon films formed on the wafers W that are held in the lower region (slots 120 to 133) were 79.85 nm to 79.98 nm. That is, the difference T2 between the upper limit value and the lower limit value of the film thicknesses of the wafers W held in the lower region of the wafer boat WB was 0.1 nm or more.

According to the result illustrated in FIG. 3 described above, by using the gas supply pipe 41 of Example 1, it may be possible to improve the inter-plane uniformity of the film thickness in the lower region of the wafer boat WB than the case of using the gas supply pipe of Comparative Example 1.

Figure 4:
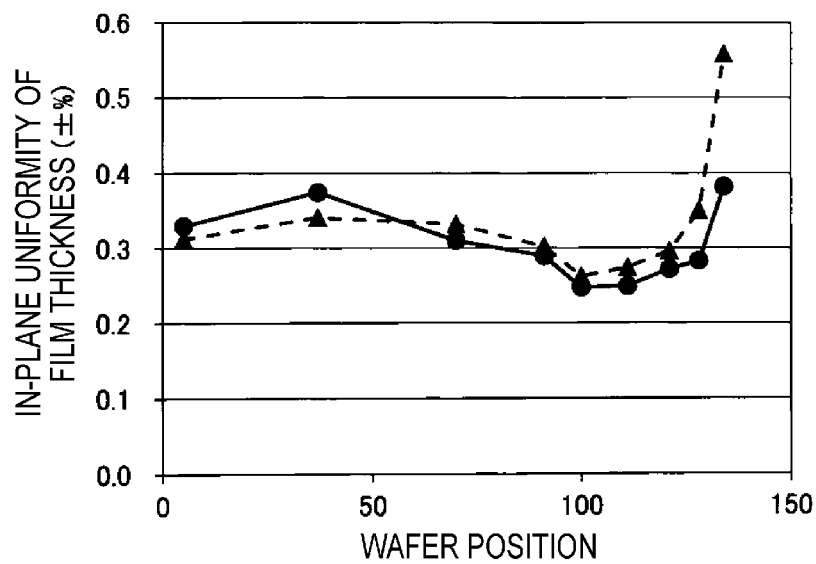
FIG. 4 is a view illustrating a relationship between a wafer position and in-plane uniformity of a film thickness.

FIG. 4 is a view illustrating a relationship between a wafer position and in-plane uniformity of a film thickness. In FIG. 4, the wafer position is illustrated on the horizontal axis, and the in-plane uniformity (±%) of the film thickness (nm) of the silicon film is illustrated on the vertical axis. The wafer position refers a position of a plural number of wafers that are held on the wafer boat WB, and a smaller number is assigned to a position close to the upper tier side. Further, in FIG. 4, the result of Example 1 is illustrated in a circular shape, and the result of Comparative Example 1 is illustrated in a triangular shape.

As illustrated in FIG. 4, when the gas supply pipe 41 of Example 1 is used, the in-plane uniformity of the film thickness of the silicon film formed on the wafer W that is held in the lower region (e.g., slot 133) was ±0.38%. Meanwhile, when the gas supply pipe of Comparative Example 1 is used, the in-plane uniformity of the film thickness of the silicon film formed on the wafer W that is held in the lower region (slot 133) was ±0.56%.

According to the result illustrated in FIG. 4 described above, by using the gas supply pipe 41 of Example 1, it may be possible to improve the in-plane uniformity of the film thickness of the silicon film formed on the wafer W held in the lower region of the wafer boat WB than the case of using the gas supply pipe of Comparative Example 1.

Figure 5:
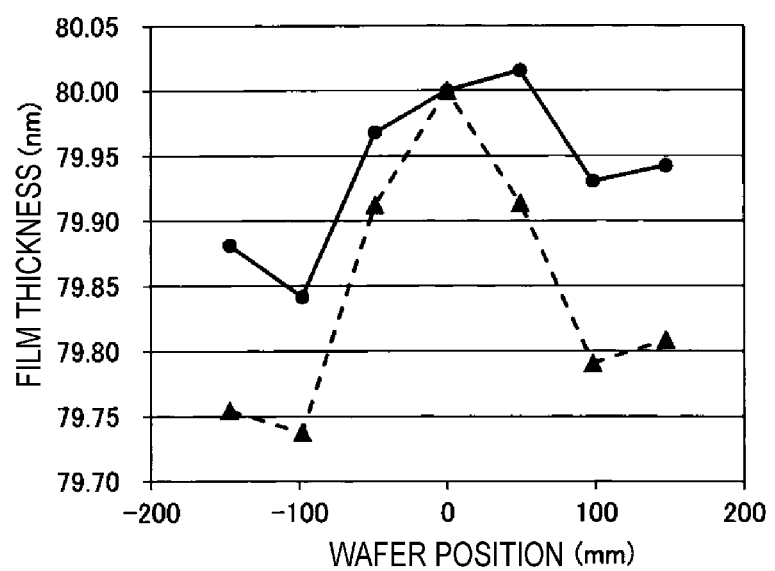
FIG. 5 is a view illustrating a film thickness distribution in a plane of a wafer.

FIG. 5 is a view illustrating a film thickness distribution in a plane of a wafer. In FIG. 5, a wafer position (mm) is illustrated on the horizontal axis, and a film thickness (nm) of a silicon film formed on a wafer W held in the lower region (slot 128) is illustrated on the vertical axis. The wafer position refers a distance (mm) from the center position of the wafer W when the center position of the wafer W is assumed 0 mm. Further, in FIG. 5, the result of Example 1 is illustrated in a circular shape, and the result of Comparative Example 1 is illustrated in a triangular shape.

As illustrated in FIG. 5, when using the gas supply pipe 41 of Example 1, the film thickness of the peripheral portion of the wafer W becomes thick. Thus, it is possible to find out that the film thickness difference between the peripheral portion and the center portion of the wafer W is smaller as compared in the case of using gas supply pipe of Comparative Example 1.

According to the result illustrated in FIG. 5 described above, by using the gas supply pipe 41 of Example 1, it may be possible to improve the in-plane uniformity of the film thickness of the silicon film formed on the wafer W held in the lower region of the wafer boat WB than the case of using the gas supply pipe of Comparative Example 1.

In the above embodiment, the wafer boat WB is an example of a substrate holder, and the wafer W is an example of a substrate, and the second cylindrical portion 21b is an example of a diameter enlarged portion.

In the above embodiment, descriptions have been made on the case where a substrate is a semiconductor wafer. However, the semiconductor wafer may be a silicon wafer, or a compound semiconductor wafer such as GaAs, SiC, and GaN. In addition, as the substrate, a glass substrate or a ceramic substrate used in a flat panel display (FPD), such as a liquid display device may be used, instead of a semiconductor wafer.

According to the present disclosure, activation of the raw material gas in the gas supply pipe may be promoted.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A heat treatment apparatus, comprising:
a processing container configured to accommodate a plurality of substrates held by a substrate holder in a shelf shape;
a gas supply source configured to supply a raw material gas into the processing container from a lower position of the processing container;
an exhaust channel including a pump configured to exhaust the raw material gas in the processing container; and
a heater arranged to cover the processing container and configured to heat the plurality of substrates;
wherein the gas supply source includes a gas supply pipe including:
a first pipe that extends upward along a longitudinal direction of an inner wall surface of the processing container;
a connection pipe where a distal end side extending above the first pipe is bent downward;
a second pipe that extends downward from the connection pipe; and
a plurality of gas ejecting holes formed in the second pipe; and
wherein the first pipe has a larger cross-sectional area than that of the second pipe.
2. The heat treatment apparatus of claim 1, wherein the gas supply pipe is provided at a position lower than a region where the substrates are arranged.

3. The heat treatment apparatus of claim 2, wherein a gas ejecting hole positioned at a highest position among the plurality of gas ejecting holes is formed on a side lower than a lowest surface of the substrate holder.

4. The heat treatment apparatus of claim 3, wherein the processing container includes an inner tube and an outer tube that are arranged coaxially to form a double tube structure,
the inner tube includes a diameter enlarged portion where a diameter of the inner tube is enlarged at a lower position, and
the gas supply pipe is provided at a height that corresponds to the diameter enlarged portion.

5. The heat treatment apparatus of claim 4, wherein the first pipe has an elliptical cross-sectional shape perpendicular to the longitudinal direction thereof.

6. The heat treatment apparatus of claim 1, wherein a gas ejecting hole at a highest position among the plurality of gas ejecting holes is formed on a side lower than a lowest surface of the substrate holder.

7. The heat treatment apparatus of claim 1, wherein the processing container includes an inner tube and an outer tube that are arranged coaxially to form a double tube structure,
the inner tube includes a diameter enlarged portion where a diameter of the inner tube is enlarged at a lower position, and
the gas supply pipe is provided at a height that corresponds to the diameter enlarged portion.

8. The heat treatment apparatus of claim 1, wherein the first pipe has an elliptical cross-sectional shape perpendicular to the longitudinal direction thereof.

9. The heat treatment apparatus of claim 1, wherein a first end portion of the first pipe is connected to the connection pipe, and the first end portion of the first pipe has a cross-sectional area that gradually decreases toward the connection pipe.

10. The heat treatment apparatus of claim 9, wherein a second end portion of the first pipe is disposed opposite the first end portion of the first pipe, and the second end portion of the first pipe has a cross-sectional area that gradually increases toward the connection pipe.

11. The heat treatment apparatus of claim 1, wherein:
the first pipe includes a straight portion,
the second pipe includes a straight portion, and
the connection pipe includes a bent portion.

12. A heat treatment method, comprising:
accommodating a plurality of substrates held by a substrate holder in a shelf shape in a processing container;
supplying a raw material gas into the processing container from a lower side position of the processing container by a gas supply source;
exhausting the raw material gas in the processing container; and
heating the plurality of substrates,
wherein the gas supply source includes:
a first pipe that extends upward along a longitudinal direction of an inner wall surface of the processing container;
a connection pipe where a distal end side extending above the first pipe is bent downward;
a second pipe that extends downward from the connection pipe; and
a gas supply pipe that includes a plurality of gas ejecting holes formed in the second pipe; and
wherein the first pipe has a larger cross-sectional area than that of the second pipe.

* * * * *